(12) United States Patent
Hitko

(10) Patent No.: US 6,952,177 B1
(45) Date of Patent: Oct. 4, 2005

(54) TRAVELING WAVE, MULTIPLYING D/A CONVERTER

(75) Inventor: Donald Hitko, Malibu, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/796,629

(22) Filed: Mar. 8, 2004

(51) Int. Cl.[7] .............................................. H03M 1/66
(52) U.S. Cl. ...................................... 341/144; 341/145
(58) Field of Search ............................... 341/144, 145, 341/135, 147, 153, 154, 156, 143

(56) References Cited

U.S. PATENT DOCUMENTS

| | | | |
|---|---|---|---|
| 5,128,674 A | 7/1992 | Kong et al. | |
| 5,134,400 A | 7/1992 | Hash | |
| 5,394,122 A | 2/1995 | Conway et al. | |
| 5,600,321 A | * 2/1997 | Wincn | 341/144 |
| 6,697,004 B1 | * 2/2004 | Galton et al. | 341/144 |

OTHER PUBLICATIONS

Cecil, J.B. and Howard, J.G.; A Fully Monolithic 6-Bit, Multiplying D/A Converter: IEEE International Solid-State Circuits Conference Proceedings; Feb. 1971, p52-53.

Krabbe, H. and Molinari, F; A Monolithic Multiplying D/A Converter Circuit; IEEE International Solid-State Circuits Conference Proceedings; Feb. 1971, p54-55, 198.

* cited by examiner

*Primary Examiner*—Peguy Jeanpierre
*Assistant Examiner*—Joseph Lauture
(74) *Attorney, Agent, or Firm*—Shimokaji & Associates, P.C.

(57) ABSTRACT

A traveling wave multiplying digital-to-analog converter has propagation-delay matched transmission lines for conversion of a high data rate digital input to a high frequency RF analog output, for example, at microwave and millimeter wave frequencies and above. The traveling wave multiplying digital-to-analog converter includes an array of constant, high impedance multiplying cells that are identical to improve component matching and propagation delay matching. The multiplying cells are connected in a spatial interleaving manner along bit lines that propagate the high bandwidth digital input. The interleaving effects a "spatial averaging" that maintains linearity of digital to analog conversion in the presence of any linear gradient δ from one cell to another across the array of multiplying cells.

49 Claims, 7 Drawing Sheets

TRAVELING WAVE, MULTIPLYING D/A CONVERTER

BACKGROUND OF THE INVENTION

The present invention generally relates to synthesis of high bandwidth, digitally modulated waveforms at microwave and millimeter wave frequencies and, more particularly, to a multiplying digital-to-analog converter (DAC) that exploits techniques of distributed amplification, also referred to as traveling wave amplification, to synthesize high resolution radio frequency (RF) signals at microwave and millimeter wave frequencies and above without mixer up-conversion, and with a clock rate that can be much lower than the RF output frequency.

While conventional superheterodyne architectures (e.g., a transceiver that uses a local oscillator to up-convert a baseband signal for modulation of an RF carrier) have yielded excellent performance in a wide range of RF transceivers, the power consumption, size, and cost of such systems have often been limiting factors in their design and deployment. An often cited "holy grail" for RF transceivers is to incorporate a single element which accepts digital data as an input and directly produces a modulated RF output for transmission via an antenna. Although a number of "bits-to-RF" direct synthesis approaches have previously been implemented, these techniques have not been able to reach microwave or millimeter wave frequencies with the resolutions, bandwidths, and tuning characteristics that are all simultaneously needed in broadband communications systems.

For example, U.S. Pat. No. 5,128,674 to Kong et al., incorporated herein by reference, discloses essentially a single quadrant multiplying design with current level shifting circuits at the input and output which allow two quadrants (in the current-voltage plane) to be covered in an NPN-only design. The shifting operation will limit the bandwidth, and the impedance properties of the single-ended design limit the achievable RF frequency and resolution (e.g., number of bits in a data word). U.S. Pat. No. 5,134,400 to Hash, incorporated herein by reference, corrects the impedance properties to support microwave frequency operation, but relies upon high electron mobility transistor (HEMT) or metal Schottky field effect transistor (MESFET) switches and R-2R resistor ladders. Requiring a HEMT or MESFET technology will limit the attainable resolution, and the RC (resistance-capacitance) time constants associated with resistor ladders inhibit the realizable data rates (e.g., adversely affecting bandwidth). U.S. Pat. No. 5,394,122 to Conway et al., incorporated herein by reference, makes use of power splitters, power combiners, RF switches, and a programmable attenuator and does not comprise a solution that can be integrated to support increasingly higher resolutions (for example, resolutions increasing beyond three bits and more) or higher data rates (e.g., 1.0 Giga-bits/second (Gbit/s) and greater).

As can be seen, there is a need for a direct "bits-to-RF" digital-to-analog (D/A) conversion to support the synthesis of high bandwidth, digitally modulated waveforms at microwave and millimeter wave frequencies. There is also a need for the ability to support high resolution signals over a wide bandwidth at microwave and millimeter-wave frequencies with a clock rate that can be much lower than the output (RF) frequency.

SUMMARY OF THE INVENTION

In one aspect of the present invention, a multiplying digital-to-analog converter includes a plurality of multiplying cells. Each multiplying cell is connected to a differential local oscillator bias signal voltage. A digital input includes a number of bits and each bit is connected to a binary-weighted number of the multiplying cells. An output connected to each of the plurality of multiplying cells provides a differential output current that is the product of the binary weighted value of the bits and differential local oscillator current.

In another aspect of the present invention, a multiplying cell includes a local oscillator input that receives a continuous time local oscillator input signal. A digital input of the multiplying cell receives a single bit digital input signal, and a balanced output, having a constant output impedance, yields a differential output current signal, the differential output current signal being the multiplication of the continuous time local oscillator input signal by the single bit digital input.

In still another aspect of the present invention, a multiplying cell includes a pair of current sources fed at a local oscillator input by a differential local oscillator bias signal voltage $V_{DC} \pm v_{LO}$ and which establish a differential local oscillator current $i_{LO}$ superimposed on a DC (direct current) bias level $I_{DC}$. Two sets of current switches are connected to the current sources and have a digital input receiving an input signal comprising a bit having states H and L. The sets of current switches provide a differential output current signal $I_{out}$ at a balanced cell output having an outl output and an outh output, so that.

$I_{out}=I_h-I_l$ where $I_h$ is the output current at the outh output and $I_l$ is the output current at the outl output; and Iout is a positive multiple of $i_{LO}$ when the bit has state H and Iout is a negative multiple of $i_{LO}$ when the bit has state L.

In yet another aspect of the present invention, a traveling wave, multiplying digital-to-analog converter includes a local oscillator transmission line wherein the differential local oscillator bias signal voltage is provided on the local oscillator transmission line; an output transmission line; and a plurality of multiplying cells. Each of the plurality of multiplying cells is connected to the local oscillator transmission line and to the output transmission line. Each of the plurality of multiplying cells establishes a differential local oscillator current $(i_{LO})$; and propagation delays at each multiplying cell are matched between the local oscillator transmission line and the output transmission line so that a plurality of output signals from each multiplying cell combine in phase on the output transmission line. A plurality of control lines provide a digital input including a plurality of bits wherein each bit is connected to the multiplying cells so that the multiplying cells provide a differential output current on the output transmission line that is a product of a binary weighting of the plurality of bits and the differential local oscillator current $(i_{LO})$.

In a yet further aspect of the present invention, a satellite transponder includes a traveling wave multiplying digital-to-analog converter having propagation-delay matched transmission lines and having an array of high and constant impedance multiplying cells for conversion of a high bandwidth digital input to a high frequency RF analog output. The array of high and constant impedance multiplying cells is connected along the transmission lines that propagate the high frequency RF analog output and along bit lines that propagate the digital input.

In a further aspect of the present invention, a method for digital-to-analog conversion includes steps of: feeding each of a plurality of multiplying cells a differential local oscillator bias signal voltage; providing a digital input including a plurality of bits; connecting each bit to a binary-weighted number of multiplying cells of the plurality of multiplying cells; connecting an output to each of the plurality of multiplying cells; and providing a differential output current at the output.

In a yet further aspect of the present invention, a method for direct bits-to-RF digital-to-analog conversion includes the steps of: propagating a local oscillator signal along an input transmission line; propagating a digital input signal along a plurality of bit control lines, the digital input signal comprising a plurality of bits, and the plurality of bits forming a digital word having a value bn; connecting a plurality of multiplying cells to the input transmission line and to an output transmission line, each of the plurality of multiplying cells establishing a differential local oscillator current; and toggling the differential local oscillator currents on the output transmission line using the multiplying cells so that a differential output current is the product of the value bn and the differential local oscillator current.

In another aspect of the present invention, a communication system includes a traveling wave, multiplying digital-to-analog converter for conversion of a digital input to a high frequency analog output. The digital-to-analog converter has propagation-delay matched transmission lines. An array of constant high impedance, multiplying cells are connected along said transmission lines, at least one of which propagates the high frequency analog output, and the array of multiplying cells are also connected along bit lines that propagate the digital input.

There is a need in the art for RF transceivers with reduced power consumption, size, and cost that incorporate a single element which accepts digital data as an input and directly produces a modulated RF output for transmission via an antenna at microwave and millimeter wave frequencies with the resolutions, bandwidths, and tuning characteristics that are all simultaneously needed in broadband communications systems. There is also a need in the art to provide such direct modulation at microwave and millimeter wave frequencies with significant reductions in the requirements for timing and component matching.

These and other features, aspects and advantages of the present invention will become better understood with reference to the following drawings, description and claims.

DETAILED DESCRIPTION OF THE INVENTION

Figure 1:
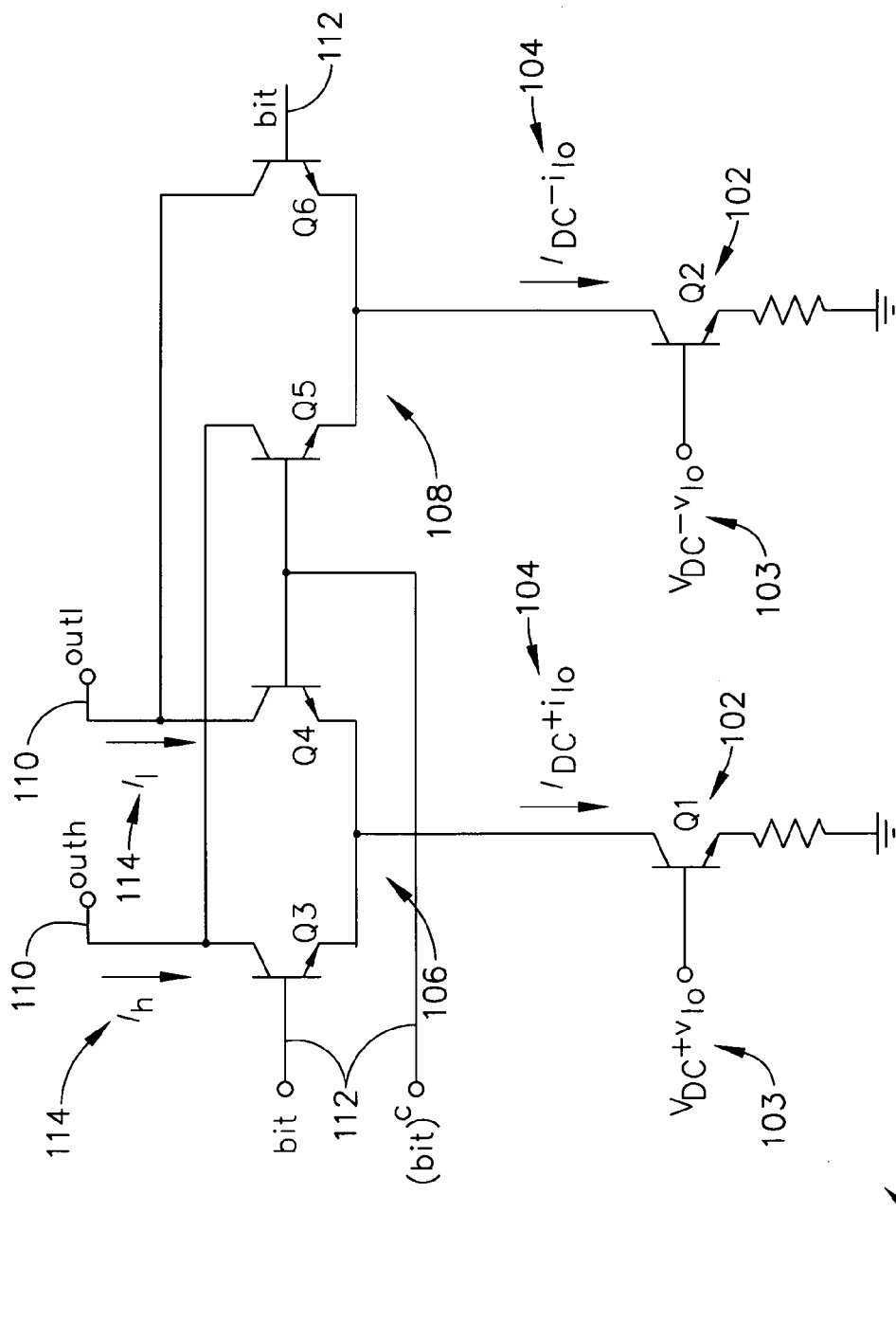
FIG. 1 is a schematic circuit diagram of a local oscillator (LO) current multiplying cell in accordance with one embodiment of the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, one embodiment of the present invention provides a direct "bits-to-RF" digital-to-analog (D/A) converter architecture that supports the synthesis of high bandwidth, digitally modulated waveforms at microwave and millimeter-wave frequencies and above. Direct bits-to-RF D/A converters are useful in communication systems wherever data or synthesized signals are being transmitted—usually wirelessly—including, for example, satellites, television, cell phones, and wireless LAN, and any of these communication systems may employ an embodiment of the present invention. In particular, transceivers incorporating an embodiment of the present invention may be used, for example, in communications satellites, where they may be effective at reducing commercial satellite payload cost and improving overall transceiver performance by providing a direct bits-to-RF data converter. More specifically, such an RF D/A converter may be particularly valuable for communications satellite transponders.

By architecting a D/A converter around a set of identical (e.g., component matched) multiplying unit cells having high and constant input and output impedances, distributed amplifier (i.e., traveling wave) concepts can be applied to greatly extend the frequency and bandwidth that can be realized. While some embodiments of the present invention may provide D/A conversion at conventional frequencies and bandwidths, the architecture of some embodiments may allow the RF output frequency to be scaled according to traveling wave concepts so that arbitrarily high frequencies and bandwidths can, in principle, be realized. For example, from a traveling wave point of view, the architecture of one embodiment provides a constant impedance structure, e.g., transmission lines connecting an array of identical cells, so that the impedance presented by the array is uniform along the length of the transmission lines, enabling waves to travel along the structure without reflection or dissipation. Related but of secondary importance is that the architecture of one embodiment may also provide a structure whose impedance may be independent of frequency so that dispersion of a wave propagating along the structure may be limited. Employing such scalability, high bandwidth D/A conversion at microwave to millimeter wave frequencies, exceeding that of the prior art, can, in practice, be realized. Furthermore, the distributed unit cell-based architecture can be arranged to leverage spatial averaging into significant reductions in the requirements for timing and component matching. These concepts, when used in conjunction with a multiplying D/A converter, allow high resolution signals to be synthesized at higher RF output frequencies than achieved in the prior art, for example, microwave and millimeter wave frequencies, without mixer up-conversion stages, and with a clock rate that can be much lower than the RF output frequency.

Embodiments of the present invention provide a traveling wave multiplying D/A architecture that addresses and overcomes limitations in the prior art by:

1) Decoupling the output frequency from the clock rate (e.g., the clock rate of the digital input signal), thereby permitting very high frequencies to be synthesized while maintaining the resolution and linearity commensurate with the bandwidth of the signal;

2) Developing a constant impedance traveling wave structure to support microwave and millimeter wave output frequencies;

3) Utilizing a unit cell-based D/A core to alleviate the matching requirements needed to achieve a given resolution; and 4) Providing an impedance-matched, self-decoding data bus, i.e., bit control lines, to yield very high data rates.

Furthermore, in many applications, an embodiment's ability to support a high resolution over a wide bandwidth can obviate the need to build a tunable transmitter. For example, different channels can be addressed merely by adjusting the input digital data stream through digital signal processing (DSP). In bringing all of these capabilities together in an approach that can be fully integrated into the communication system, the proposed architecture can provide a tremendous flexibility in the design of microwave and millimeter wave communication systems. In general, microwave and millimeter wave frequencies refer to frequencies greater than about 1.0 GHz, and such frequencies may correspond to electromagnetic waves having wavelengths, when radiating in free space, that are about 300 mm and shorter. (In guided wave media, the corresponding wavelengths may be considerably shorter.)

Referring now to FIG. 1, an exemplary circuit diagram for a local oscillator (LO) current multiplying "unit cell" 100 is shown in accordance with one embodiment. To be able to realize a traveling wave, multiplying D/A converter, a "unit cell" circuit—such as unit cell 100—may be first needed as an element which provides for 1) the multiplication of a continuous-time LO input signal by a single bit digital input, and 2) constant (and large-valued, e.g., 1,000 Ω (ohms) and greater) input and output impedances. FIG. 1 illustrates one example circuit of a unit cell 100 having these properties. Unit cell 100, for example, may be topologically similar to a doubly-balanced active mixer. In other words, the interconnections of components, such as current sources and switches, and circuit routing of signals, such as input signals and output signals, may be similar. The current sources 102 (Q1–Q2) may establish a differential LO current 104 ($\pm i_{LO}$) superimposed on a DC bias level ($I_{DC}$). For example, current sources 102 may be fed a differential LO bias signal voltage 103 ($V_{DC} \pm V_{LO}$). Two sets of current switches 106, 108 (Q3–Q4, Q5–Q6) toggle the direction of these LO currents 104 as applied to the balanced unit cell output 110 (output current $I_h$ at $out_h$, output current $I_l$ at $out_l$) based on the state of the digital input 112 (labeled "bit" in FIG. 1). (Note that digital input 112 "bit" connected at of is the same as "bit" connected at Q3—the connecting line is not shown to simplify the drawing. Also, note that "(bit)$^c$" is the inverse, or complement, of "bit", i.e., (bit)$^c$ is L when bit is H and (bit)$^c$ is H when bit is L.) The operation of the multiplying unit cell 100 is summarized in Table 1. The differential output current signal 114 ($I_{out} = I_h - I_l$) is $+2i_{LO}$ when bit is high (H) and $-2i_{LO}$ when bit is low (L), thus yielding an output signal (e.g., differential output current signal 114) having only a component at the applied LO frequency.

TABLE 1

Logic Table for the LO Current Multiplying Unit Cell

| bit | $I_h$ | $I_l$ | $I_{out} = I_h - I_l$ |
|---|---|---|---|
| H | $I_{DC} + i_{LO}$ | $I_{DC} - i_{LO}$ | $+2i_{LO}$ |
| L | $I_{DC} - i_{LO}$ | $I_{DC} + i_{LO}$ | $-2i_{LO}$ |

Figure 2:
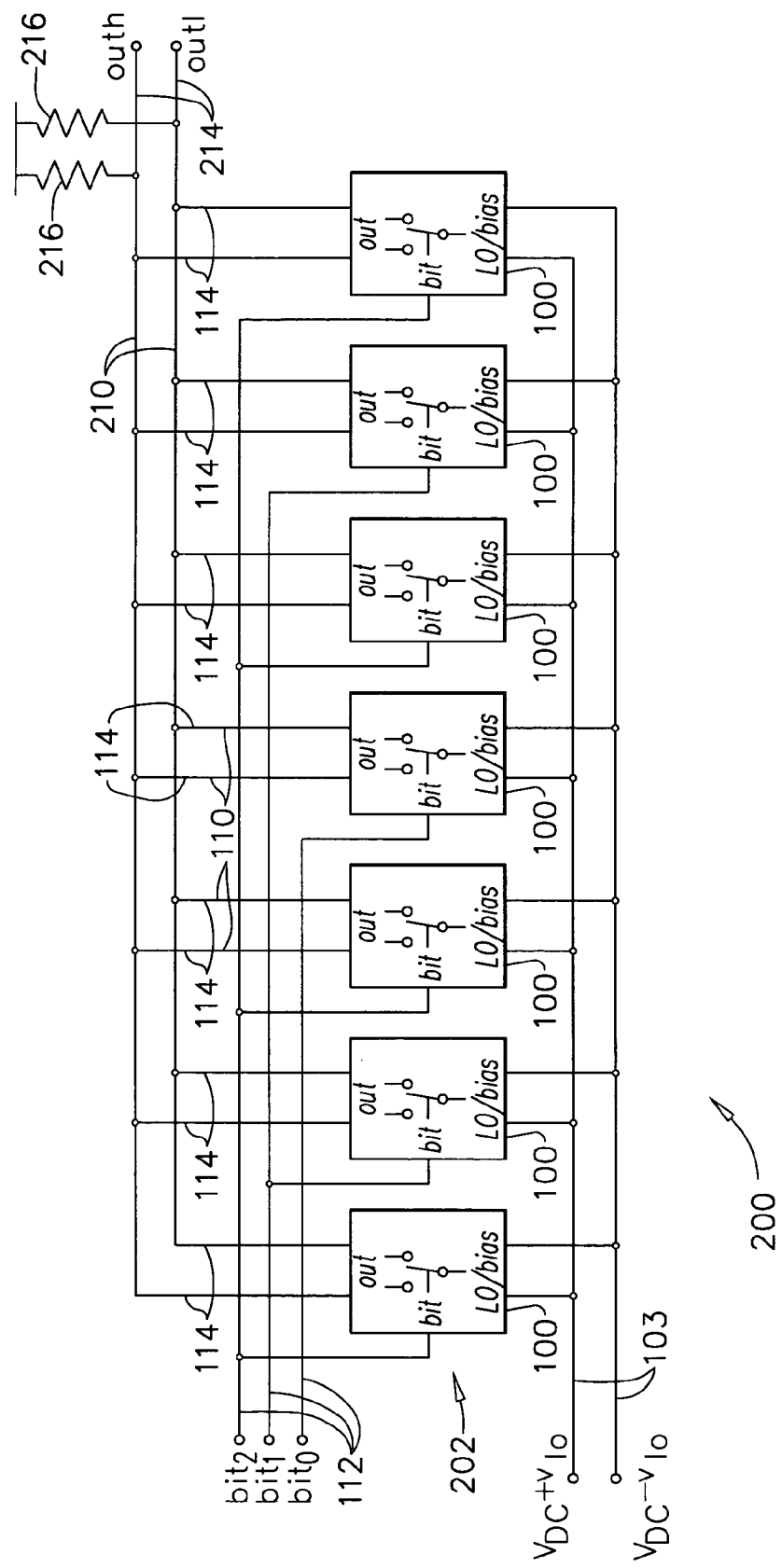
FIG. 2 is a schematic circuit diagram of a unit-cell based multiplying digital-to-analog (D/A) converter according to one embodiment of the present invention.

The constant, i.e., state independent, output impedance and bias current properties of the multiplying unit cell 100 allow a multi-bit (e.g. N-bit) multiplying D/A converter to be realized by ganging together $2^N - 1$ copies of the unit cell and connecting the appropriate binary-weighted number of cells to each digital input. For example, FIG. 2 illustrates a multi-bit multiplying D/A converter 200 with N=3, according to one embodiment. To simplify the drawings, digital input 112 signals are shown single-ended, i.e., the inverse (bit)$^c$ of each bit is not shown. Note that input bit$_2$ may be connected to four unit cells 100, bit$_1$ may be connected to two unit cells 100, and bit$_0$ may be connected to one unit cell 100 so that the weights for digital inputs 112, bit$_2$, bit$_1$, and bit$_0$, may be respectively 4, 2, and 1.

Still referring to FIG. 2, unit cell outputs 110, connected to output 210 of D/A converter 200, may be biased by load resistors 216, which may have any value that provides an appropriate load impedance. For example, the size of the load resistors 216 may be constrained by various factors including power supply headroom, power dissipation, and transistor breakdown. Driving each unit cell 100 with the same LO/bias signal voltage 103, the unit cell outputs 110 may be connected to yield a differential output current 214 ($i_{out}$) given by the following formula:

$$i_{out} = 2(\text{bit}_2 2^2 + \text{bit}_1 2^1 + \text{bit}_0 2^0)i_{LO} \qquad (1)$$

where the expression in parentheses is the value of the input digital word, hereafter referred to as $b_n$. Stated more generally, the output current 214 ($i_{out}$) from the multiplying D/A converter 200 can be recognized as the product of $b_n$ and the LO signal ($i_{LO}$). (The factor of 2 arises from the fully differential current sources where the amplitude of each side is taken as $i_{LO}$.) Equivalently, the digital input can be viewed as modulating the envelope of the LO by setting its amplitude from bit time to bit time (as determined, for example, by the clock rate), effectively up-converting the digital data about the LO.

As seen in FIG. 2, while the multiplying D/A converter 200 may comprise logical groupings of unit cells 100 (according to which bit of $b_n$ the unit cells are connected to), the arrangement of each logical grouping need not be comprised of physically adjacent cells 100. Basing an architecture upon identical unit cells provides a flexibility to construct patterns in the groupings. One particularly useful arrangement may be to interleave the bit positions, thereby effecting a "spatial averaging" across the array 202 of unit cells 100. By making the most significant bit (MSB) consist of every other cell 100 throughout the array 202, and then filling the gaps from the outside toward the middle with the remaining bits (starting with the next most significant bit) linear gradients across the array 202 may be averaged out in the summation which forms the output current 214. Such gradients may result, for example, from process, temperature or electrical limitations (e.g., attenuation) and may defeat the linearity of the D/A conversion at output 214 if not compensated for.

Returning again to the 3-bit case shown in FIG. 2, $bit_2$ (the MSB) may connect to every other unit cell 100 (as shown) while $bit_0$ (the least significant bit, LSB) may connect to a single unit cell 100 at the center of the array 202 and $bit_1$ (the next most significant bit) may connect to the remaining cells 100. Consider, for example, an attenuation of the LO/bias signal 103 from left to right across the array 202 such that the amplitude of the LO current decreases by a factor δ from one unit cell 100 to the adjacent unit cell 100. If the first cell flows $\pm(1+\delta) i_{LO}$, the second $\pm(1+2\delta) i_{LO}$, and so on, the middle cell in the array 202 will flow $\pm i_{LO}$, and the last will see $\pm(1-3\delta) i_{LO}$. Thus, the output from the LSB $bit_0$ will be $\pm i_{LO}$, $bit_1$ will provide $\pm[(1+2\delta)+(1-2\delta)] i_{LO} = \pm 2 i_{LO}$, and the MSB $bit_2$ will similarly sum to $\pm 4 i_{LO}$. Linearity in the D/A conversion may therefore be maintained in the presence of any linear gradient across the array 202 of unit cells 100, including those gradients which may result from device or timing mismatches.

By extending the above-described techniques using more unit cells, a multiplying D/A converter of arbitrary resolution, i.e., N-bit, where N may be any positive integral value, may—in principle—be realized. However, for converter resolutions beyond about 8–9 bits, the power consumption and die area needed for an array of $2^N - 1$ unit cells may become prohibitive. An alternative approach for extending the resolution is to incorporate bits that may interpolate between successive states of the unit cell array.

Figure 3:
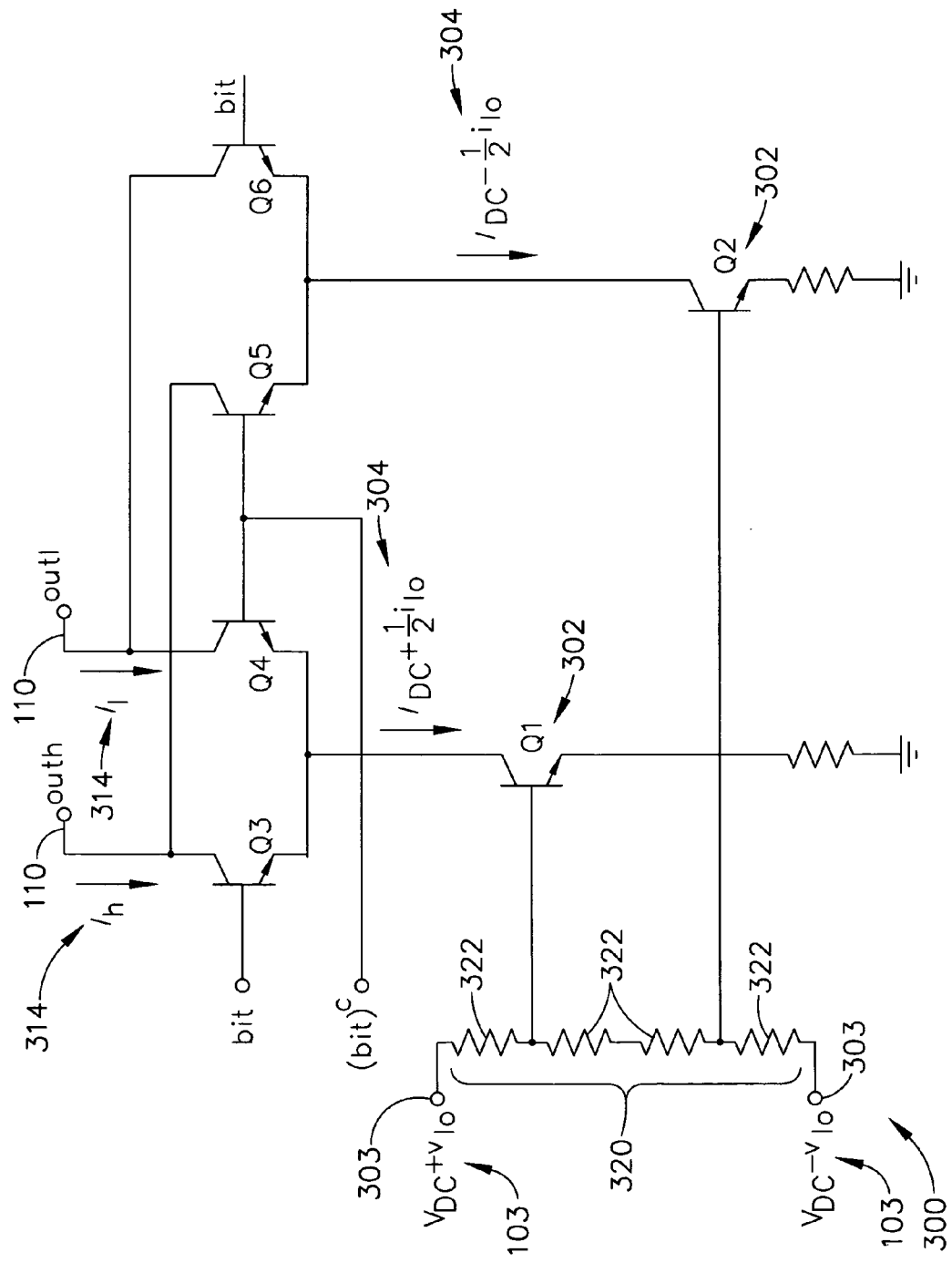
FIG. 3 is a schematic circuit diagram of an LO current multiplying interpolation cell in accordance with one embodiment of the present invention.

One means of implementing an interpolation bit may be to affix a resistive attenuator 320 to the LO input 303 of a multiplying unit cell 100 to provide a multiplying interpolation cell 300, as shown in FIG. 3. As the differential bias LO feed lines (not shown in FIG. 3) connected to LO input 303 are at the same DC potential, no DC current (neglecting base currents) may flow in the attenuator 320 and the current sources 302 (Q1–Q2) may have the same bias ($I_{DC}$) as in the unit cells 100. However, provided that the current sources 302 (Q1–Q2) function as linear transconductors, the $+v_{LO}/2$ furnished by an attenuator 320 with four equal-valued resistors 322 may result in the current sources 302 (Q1–Q2) establishing a differential LO current 304 ($\pm i_{LO}$)/2 superimposed on a DC bias level ($I_{DC}$). Thus, a differential output current signal 314 ($I_{out} = I_h - I_l$) may be $\pm i_{LO}$ ($bit_n$), which may be half the output of a unit cell 100 in the array 202. Of further significance is that this interpolation may be achieved with a circuit (e.g., multiplying interpolation cell 300) having the same output impedance properties and the same input signals—differential LO bias signal voltage 103—as the unit cell 100. These features may allow the interpolation cells 300 to be incorporated into the unit cell 100 array 202, while maintaining all of the advantages of component matching and spatial averaging afforded by the unit cell approach.

Additional interpolation bits, i.e., additional levels for differential output current signal 314 ($I_{out}$), may be obtained simply by tapping the resistive attenuator 320 in different locations (e.g. to get $I_{DC} \pm i_{LO}/4$, $I_{DC} \pm i_{LO}/8$, etc.) The additional differential output levels may be similar to the binary weights for digital inputs 112 as described above, and example output level weights are indicated by numerals on interpolation cells 300 shown in FIGS. 5 and 6. It should be noted that the additional output levels may be realized without employing an R-2R ladder to split or combine LO/RF signals, allowing multiple bits of interpolation to be realized in a high frequency, high bandwidth data converter.

Using m interpolation bits—or interpolation cells 300—may reduce the number of total number of cells in an N-bit multiplying D/A to:

$$(2^{N-m}-1)+m. \quad (2)$$

Figure 5:
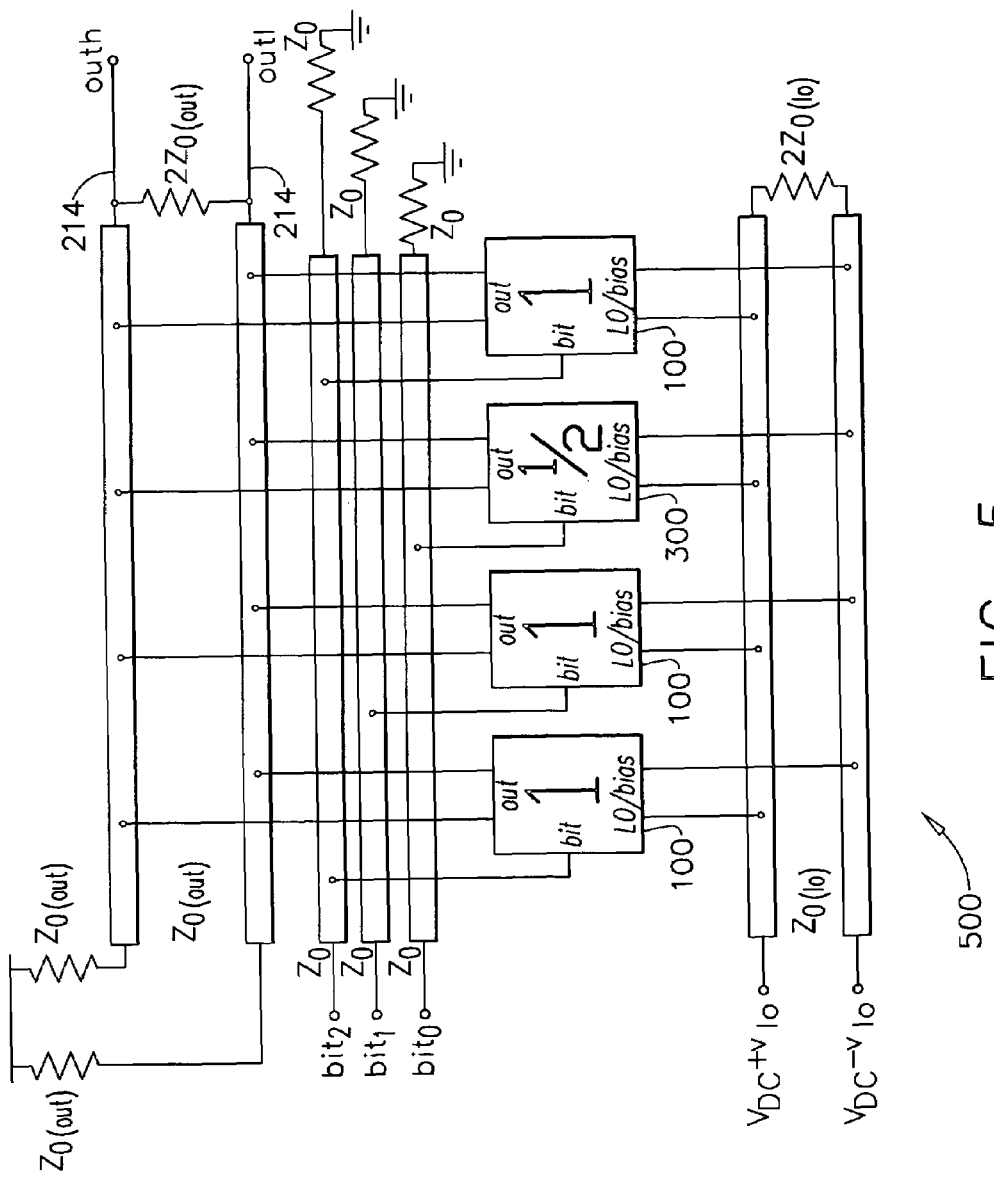
FIG. 5 is a schematic circuit diagram of a mixed unit-cell/interpolation cell based traveling wave multiplying D/A converter according to another embodiment of the present invention.
Figure 6:
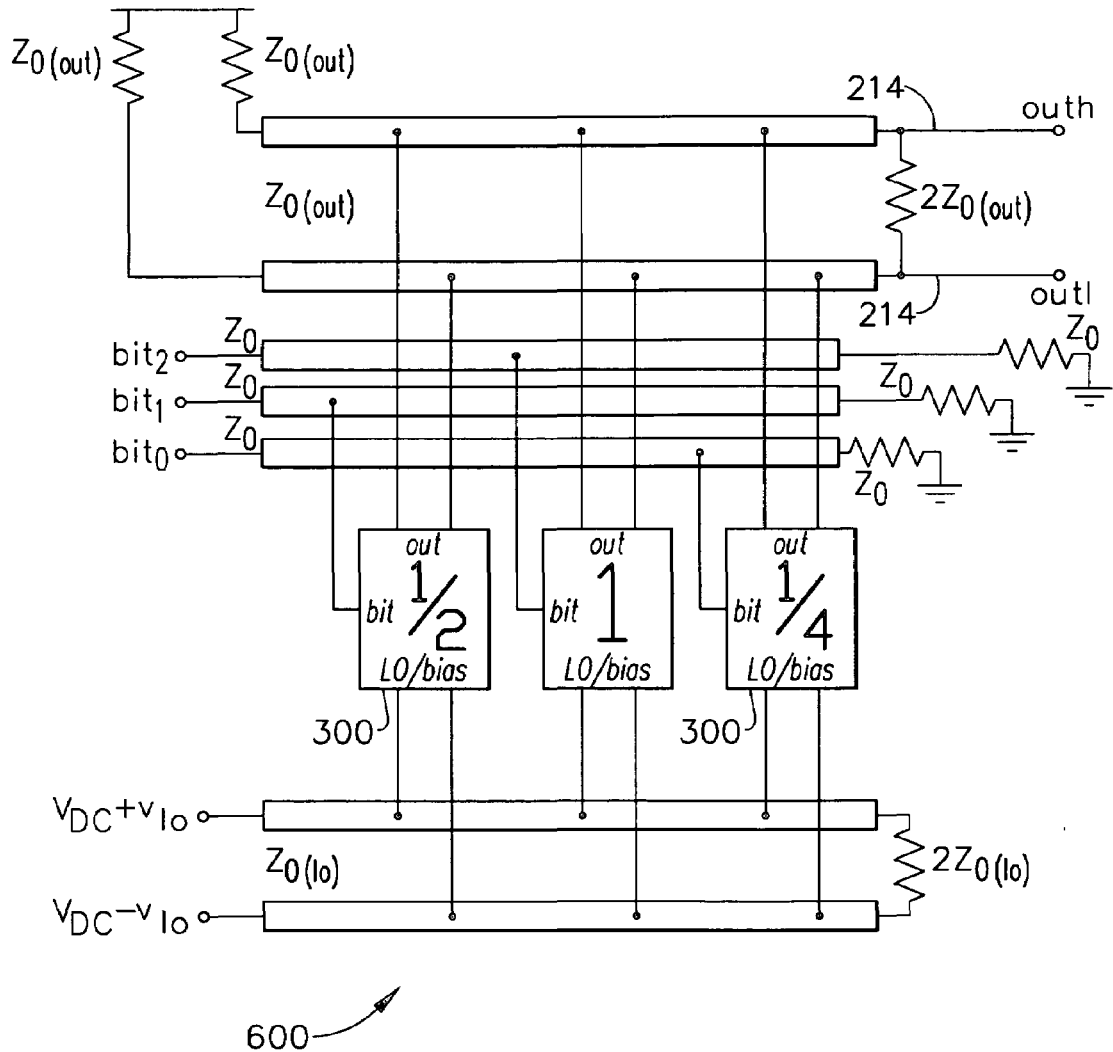
FIG. 6 is a schematic circuit diagram of an interpolation-cell based traveling wave multiplying D/A converter according to another embodiment of the present invention.

Conceivably, then a multiplying D/A converter could be achieved with just m=N interpolation bits or interpolation cells 300. For example, FIG. 6 illustrates a multiplying D/A converter 600 for the case m=N=3, which may use just three interpolation cells 300 to provide the same 3-bit resolution provided by seven unit-cell multiplying D/A converter 200 shown in FIG. 2. Most designs, however, may benefit from some mixture of unit cells 100 and interpolation cells 300. For example, FIG. 5 illustrates a multiplying D/A converter 500 for the case N=3 and m=1, which may use four cells to provide the same 3-bit resolution provided by seven unit-cell multiplying D/A converter 200 shown in FIG. 2. In these two figures, the weights for digital inputs 112, as described above, are indicated by the number on each multiplying cell 100 or 300.

Figure 4:
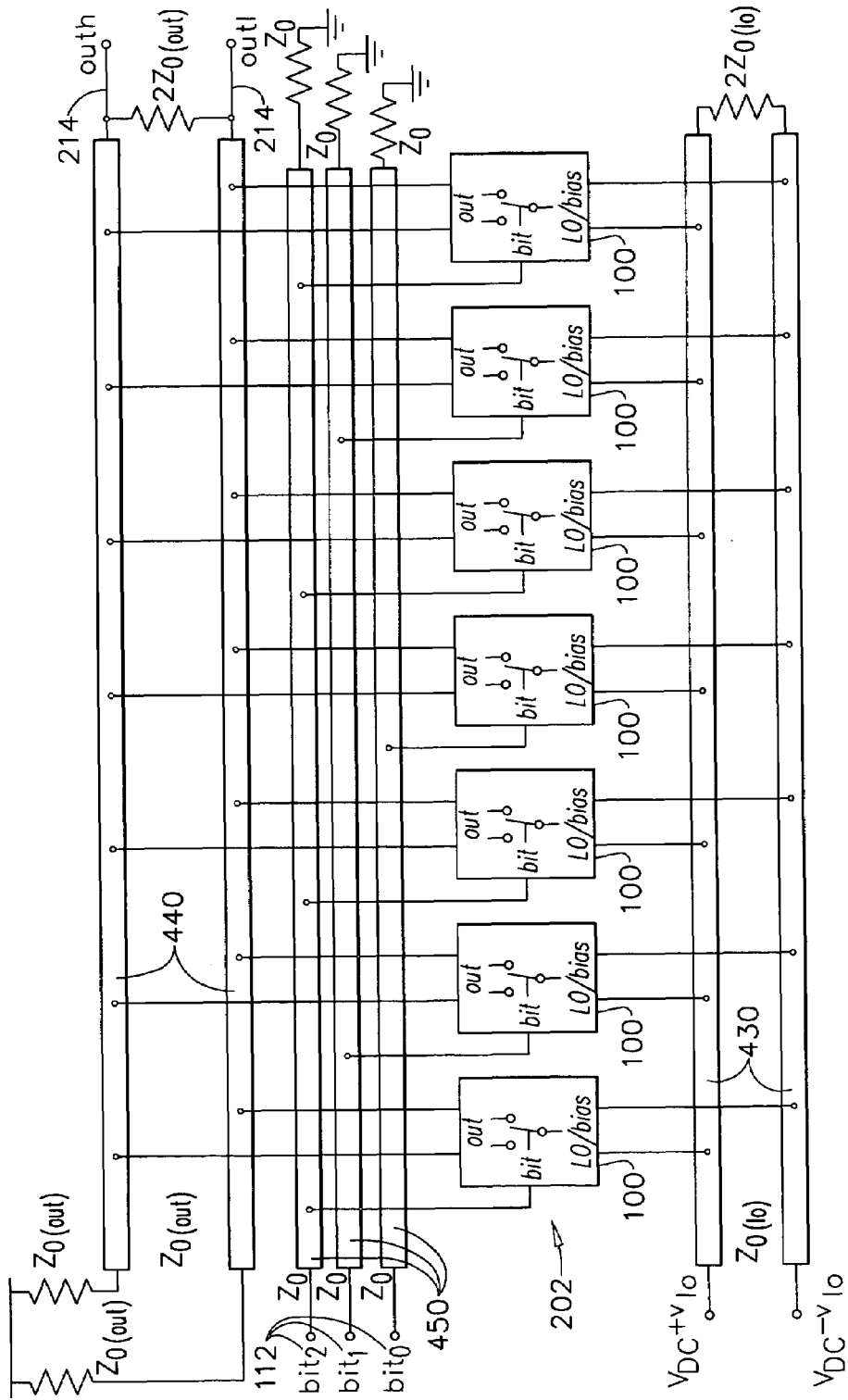
FIG. 4 is a schematic circuit diagram of a unit-cell based traveling wave multiplying D/A converter according to one embodiment of the present invention.

Exemplary traveling wave multiplying D/A converters 400, 500, 600 are shown in FIGS. 4, 5, and 6 according to various embodiments. As seen in FIG. 4, for example, multiplying unit cells 100 may be arrayed along input (LO) transmission line 430 and output transmission line 440. Considering now that the multiplying unit cells 100 (and interpolation cells 300) have high (and constant) input and output impedances, the cells may be arrayed along input and output transmission lines 430, 440 without appreciably impacting the signals traveling on those lines. Furthermore, any capacitances at the inputs and outputs of the unit cells can be absorbed into the characteristic impedances $Z_0$ of the transmission lines 430, 440, allowing very high frequencies to be handled by the D/A core of the architecture (e.g. D/A converter 400). For example, the architecture allows the frequencies to be scaled, as described above, to accommodate microwave and millimeter wave frequencies and higher.

Such an arrangement of multiplying cells 100, 300 arrayed along input and output transmission lines 430, 440, as depicted in FIGS. 4, 5, and 6, may be similar to that of a distributed amplifier. Provided that the LO transmission lines 430 and output transmission lines 440 have the same propagation velocities, the output signals 114 from each unit (interpolation) multiplying cell 100 will combine in phase—producing output signal 214—as each LO to output path (e.g., a path from LO transmission line) will see the same overall delay. The condition for matched velocities is that the product of the inductance and capacitance per unit length of the loaded transmission lines 430, 440 (i.e., including the input and output capacitances from the unit cell 100 at each tap point) must match between the LO lines 430 and the output lines 440. Alternatively, if the propagation velocities could not be matched, the transmission line on one side could be made slightly longer than the other to equalize the delay from cell to cell, as apparent to one of ordinary skill in the art. Additionally, a variety of options are known in the art for matching propagation delays in distributed amplifiers, which may be applied to embodiments of the traveling wave data converter of the present invention.

Nominally, the delays along the control (or bit) lines 450 must also match—both each other and the delays along the LO and output transmission lines 430 and 440. Distributing dummy loading (as known in the art) along the control lines 450 can equalize the number of capacitive loads driven by each digital input 112 signal, allowing the velocities to match for the digital input 112 signals (in spite of the different number of multiplying cells driven by each bit line 450). However, a constant error in velocity along a control line 450 may represent a linear error term in the delay along the array 202, and may thus be compensated through the spatial averaging achieved by interleaving (described above). Very high data rates for digital input 112 signals can thus be achieved. For example, bit rates exceeding 1.0 Gbit/s for digital input bits 112 may be realized. The interleaved unit cell architecture proposed here thus provides improved data converter linearity in the presence of dynamic errors as well as static errors.

Applying traveling wave concepts to the multiplying D/A approach greatly extends the bandwidth, output frequency, and resolution that can be achieved with a data converter—such as data converters 400, 500, 600. This combination of extended bandwidth, output frequency, and resolution can be enabled by the realization of multiplying circuits (unit cells 100 and interpolation cells 300) having constant and high valued terminal impedances. For example, the terminal impedances of the multiplying circuits (e.g., cells 100, 300) should be much greater (e.g., by a factor of 10 or more) than the characteristic impedance, $Z_0$, of the transmission lines 430 and 440. As for the output impedance of the traveling wave D/A converters 400, 500, 600, the output impedance of the converter 400, for example, should match the characteristic impedance of the output transmission lines 440. For example, a matching output impedance to a typical characteristic impedance of the output transmission lines may have a value in the neighborhood of 30 Ω.

By constructing an embodiment—such as converter 200 or converters 400, 500, or 600—of identical multiplying cells—such as unit cells 100 or interpolation cells 300 or combinations of both—good component matching (e.g., of transistor properties and resistor values) as well as matching of propagation delays, may be achieved. In addition, by constructing an embodiment of an array of identical multiplying cells to improve component matching and matching of propagation delays, and by spatially averaging across the array, for example, by interleaving the connections of the multiplying cells on the bit control lines (as described above) to cancel linear gradients that may result, for example, from process, temperature or electrical limitations (e.g., attenuation), linearity in the D/A conversion may be preserved. Collectively, the features disclosed here may yield a significant advance in the resolution, bandwidth, and tuning characteristics of direct bits-to-RF converters—such as converters 400, 500, 600—which may operate at microwave and millimeter wave frequencies and above, while being amenable to the requirements of integration and low power consumption.

Figure 7:
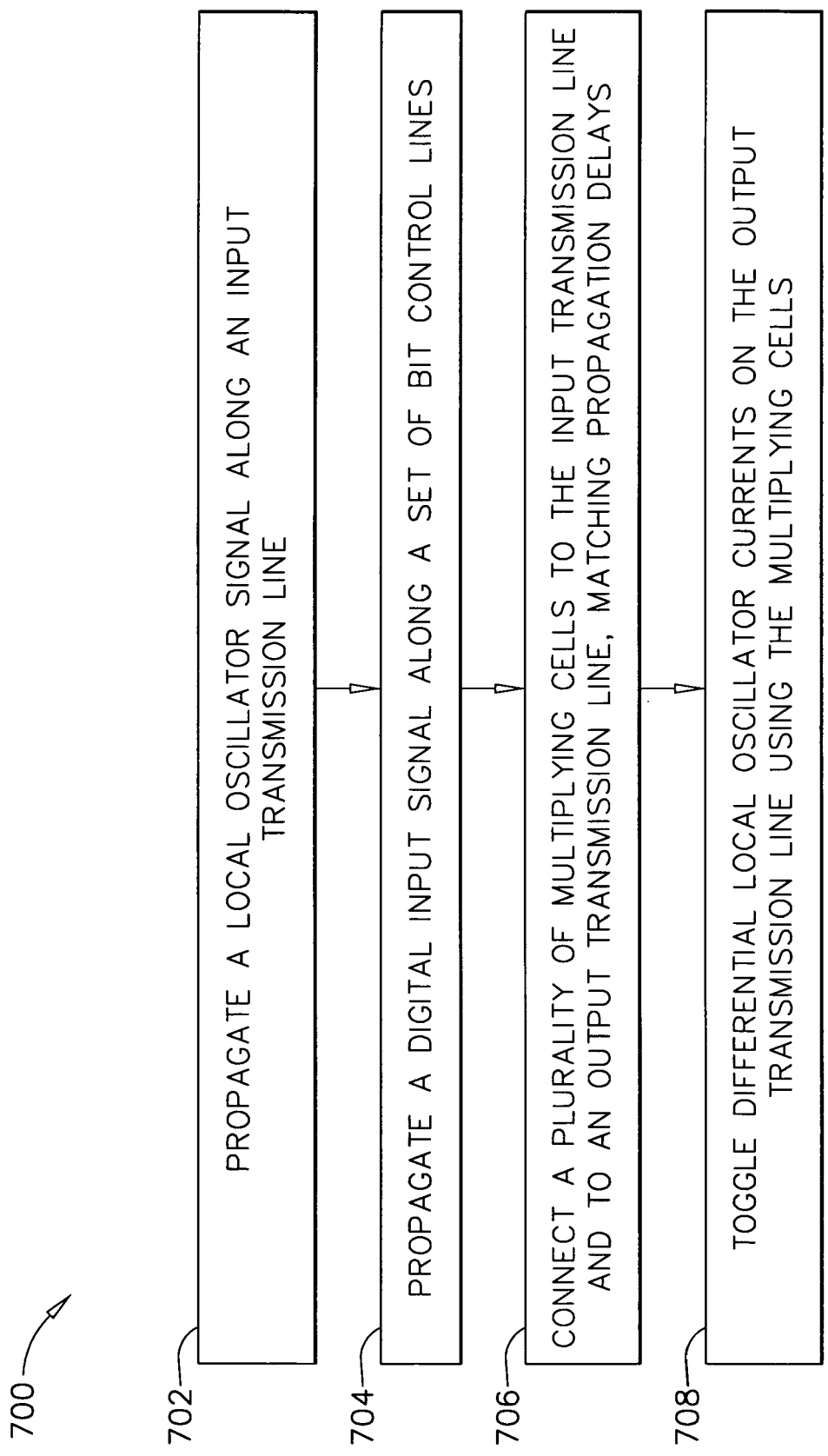
FIG. 7 is a flowchart diagram for a method for direct bits-to-RF digital-to-analog conversion according to one embodiment of the present invention.

FIG. 7 illustrates a method 700 for direct bits-to-RF digital-to-analog conversion. At step 702, a local oscillator signal—such as differential LO bias signal voltage 103—may be propagated along an input transmission line—such as input transmission line 430. Also, a digital input signal—such as digital input 112—may be propagated, at step 704, along a bit control line—such as bit control lines 450. At step 706, the input transmission line 430 and output transmission line 440 may be connected through a plurality of multiplying cells—such as unit cells 100 or interpolation cells 300—which may establish a differential LO current 104 ($\pm i_{LO}$). The multiplying cells may be connected so that propagation delays are matched and so that signals propagating along the transmission lines may combine in phase, enabling high bandwidth data conversion at high frequencies, for example, at microwave and millimeter wave frequencies and above. Furthermore, either a binary-weighted number of multiplying unit cells 100, or an interpolation cell 300 providing the appropriate binary weighted interpolation bit, may be connected at each bit control line so that, at step 708, toggling the differential LO currents on the output transmission line using the multiplying cells may produce a differential output current that may be the product of the value of the weighted binary bits of digital input 112 and the differential LO current 104.

It should be understood, of course, that the foregoing relates to preferred embodiments of the invention and that modifications may be made without departing from the spirit and scope of the invention as set forth in the following claims.

I claim:

1. A multiplying digital-to-analog converter comprising:
   a plurality of multiplying cells, wherein each multiplying cell is connected to a differential local oscillator bias signal voltage;
   a local oscillator transmission line wherein said differential local oscillator bias signal voltage is provided on said local oscillator transmission line, and each of said plurality of multiplying cells is connected to said local oscillator transmission line;
   a digital input including a plurality of bits, wherein each bit is connected to a binary-weighted number of said multiplying cells;
   an output connected to each of said plurality of multiplying cells, wherein a differential output current is provided at said output; and
   an output transmission line wherein:
      said output is provided on said output transmission line; and
      each of said local oscillator transmission line and said output transmission lines has a propagation delay and said propagation delays are matched.

2. The multiplying digital-to-analog converter of claim 1 wherein:
   said plurality of bits of said digital input forms a digital word having a value $b_n$;
   each of said plurality of multiplying cells establishes a differential local oscillator current ($i_{LO}$); and
   said differential output current is the product of said value $b_n$ and said differential local oscillator current ($i_{LO}$).

3. The multiplying digital-to-analog converter of claim 1 wherein:
   said differential output current is the sum of a plurality of differential output currents of the plurality of multiplying cells.

4. The multiplying digital-to-analog converter of claim 1, further comprising:
   a plurality of bit lines wherein:
   each bit of said digital input is provided on a distinct one of said plurality of bit lines;
   each bit has a significance from most significant to least significant; and
   a binary-weighted number of multiplying unit cells is connected to at least one bit line of said plurality of bit lines, wherein said binary-weighted number matches the significance of the bit of said bit line.

5. The multiplying digital-to-analog converter of claim 1, further comprising:
   a plurality of bit lines wherein:
   each bit of said digital input is provided on a distinct one of said plurality of bit lines;
   each bit has a significance from most significant to least significant; and a multiplying interpolation cell is connected to at least one bit line of said plurality of bit lines, wherein said interpolation cell provides an output level that matches the significance of the bit of said bit line.

6. The multiplying digital-to-analog converter of claim 1, further comprising:
a plurality of bit lines wherein:
each of said plurality of bit lines has a propagation delay and said propagation delays are matched.

7. The multiplying digital-to-analog converter of claim 1, further comprising:
a local oscillator transmission line;
an output transmission line; and
a plurality of bit lines wherein:
each of said local oscillator transmission line, said output transmission line, and each of said plurality of bit lines has a propagation delay and all of said propagation delays are matched.

8. The multiplying digital-to-analog converter of claim 1 wherein:
said plurality of multiplying cells are component-matched identical cells.

9. A multiplying cell comprising:
a local oscillator input that receives a continuous time local oscillator input signal;
a digital input that receives a single bit digital input;
a balanced output, having a constant output impedance, that yields a differential output current signal, said differential output current signal being the multiplication of said continuous time local oscillator input signal by said single bit digital input.

10. The multiplying cell of claim 9, further comprising:
a pair of current sources connected to said continuous time local oscillator input signal, where said pair of current sources establish a differential local oscillator current.

11. The multiplying cell of claim 9, further comprising:
a pair of current sources connected to said continuous time local oscillator input signal, where said pair of current sources establish a differential local oscillator current; and
two sets of current switches connected to said current sources and to said digital input, wherein said sets of current switches toggle the direction of said differential local oscillator current at said balanced output to yield said differential output current signal, and said sets of current switches toggle the direction of said differential local oscillator current based on the state of said single bit digital input.

12. The multiplying cell of claim 9 wherein an impedance of said digital input is high.

13. The multiplying cell of claim 9 wherein an impedance of said local oscillator input is high.

14. The multiplying cell of claim 9 wherein an impedance of said balanced output is high and constant.

15. The multiplying cell of claim 9 further comprising an attenuator across said local oscillator input and wherein said differential output current signal is provided at a different additional level to provide an interpolation bit.

16. A multiplying cell comprising:
a pair of current sources fed at a local oscillator input by a differential local oscillator bias signal voltage $V_{DC} \pm V_{LO}$ and that establish a differential local oscillator current $i_{LO}$ superimposed on a DC bias level $I_{DC}$;
two sets of current switches connected to said current sources and having a digital input receiving an input signal comprising a bit having states H and L, wherein:

said sets of current switches provide a differential output current signal $I_{out}$ at a balanced cell output having an out1 output and an outh output;
$I_{out} = I_h - I_l$ where $I_h$ is the output current at the outh output and $I_l$ is the output current at the out1 output; and
$I_{out}$ is a positive multiple of $i_{LO}$ when said bit has state H and Iout is a negative multiple of $i_{LO}$ when said bit has state L.

17. The multiplying cell of claim 16 wherein:
said input signal has a bit rate exceeding 1.0 Gbit/s.

18. The multiplying cell of claim 16 wherein:
said differential local oscillator bias signal voltage has a frequency of about 1.0 GHz or higher.

19. The multiplying cell of claim 16 wherein:
said multiplying cell has high and constant impedances at said local oscillator input, said digital input, and said balanced cell output.

20. The multiplying cell of claim 16 wherein:
the multiplying cell is a unit cell and $I_{out} = +2i_{LO}$ when said bit has state H and $I_{out} = -2i_{LO}$ when said bit has state L.

21. The multiplying cell of claim 16 further comprising:
a resistive attenuator, said resistive attenuator being tapped to feed a differential local oscillator bias signal voltage $V_{DC} \pm Kv_{LO}$ to said pair of current sources; and
the multiplying cell is an interpolation cell and $I_{out} = +2Ki_{LO}$ when said bit has state H and $I_{out} = -2Ki_{LO}$ when said bit has state L.

22. A traveling wave, multiplying digital-to-analog converter comprising:
a local oscillator transmission line wherein a differential local oscillator bias signal voltage is provided on a local oscillator transmission line;
an output transmission line;
a plurality of multiplying cells, wherein:
each of said plurality of multiplying cells is connected to said local oscillator transmission line and to said output transmission line;
each of said plurality of multiplying cells establishes a differential local oscillator current ($i_{LO}$); and
propagation delays at each multiplying cell are matched between said local oscillator transmission line and said output transmission line so that a plurality of output signals from each multiplying cell combine in phase on said output transmission line; and
a plurality of control lines providing a digital input including a plurality of bits wherein each bit is connected to said multiplying cells so that said multiplying cells provide a differential output current on said output transmission line that is a product of a binary weighting of said plurality of bits and said differential local oscillator current ($i_{LO}$).

23. The traveling wave, multiplying digital-to-analog converter of claim 22 wherein:
said plurality of multiplying cells are connected to said plurality of control lines so that multiplying cells connected to one bit of said plurality of bits are interleaved among all other multiplying cells of said plurality of cells.

24. The traveling wave, multiplying digital-to-analog converter of claim 22 wherein:
said plurality of multiplying cells are connected to said plurality of control lines so that spatial averaging of said plurality of bits from most significant bit to least significant bit maintains linearity of digital-to-analog conversion in the presence of any linear gradient across the plurality of multiplying cells.

25. A satellite transponder comprising:
a traveling wave multiplying digital-to-analog converter having propagation-delay matched transmission lines and having an array of high and constant impedance multiplying cells for conversion of a high bandwidth digital input to a high frequency RF analog output wherein said array of high and constant impedance multiplying cells are connected along said transmission lines that propagate said high frequency RF analog output and along bit lines that propagate said high bandwidth digital input.

26. The satellite transponder of claim 25 wherein said array of multiplying cells are identical component-matched multiplying cells having nominally identical impedances and propagation delays so that a plurality of output signals from each multiplying cell combine in phase on at least one of said transmission lines.

27. The satellite transponder of claim 25 wherein said array of multiplying cells are interleavedly connected along said bit lines so that linearity of digital to analog conversion is preserved in the presence of any linear gradient from one cell to another across said array of multiplying cells.

28. The satellite transponder of claim 25 wherein said high frequency is at least as high as a microwave frequency.

29. The satellite transponder of claim 25 wherein said high bandwidth digital input has a bit rate of at least 1.0 Gbit/s.

30. The satellite transponder of claim 25 wherein said digital input has a resolution of at least three bits.

31. The satellite transponder of claim 25 wherein a multiplying cell of said array of multiplying cells includes:
a local oscillator input that receives a continuous time local oscillator input signal;
a digital input that receives a single bit digital input; and
a balanced output, having a constant output impedance, that yields a differential output current signal, said differential output current signal being the multiplication of said continuous time local oscillator input signal by said single bit digital input.

32. A method for digital-to-analog conversion comprising steps of:
propagating a differential local oscillator bias signal voltage along a local oscillator transmission line;
feeding each of a plurality of multiplying cells said differential local oscillator bias signal voltage;
providing a digital input including a plurality of bits;
connecting each bit to a binary-weighted number of multiplying cells of said plurality of multiplying cells;
connecting an output to each of said plurality of multiplying cells; and
providing a differential output current at said output;
propagating said differential output current along an output transmission line; and, matching propagation delays of said local oscillator transmission line and said output transmission line.

33. The method of claim 32 further comprising steps of:
establishing a differential local oscillator current ($i_{LO}$); and
forming said differential output current as the product of a value $b_n$ and said differential local oscillator current ($i_{LO}$) wherein said plurality of bits of said digital input forms a digital word having said value $b_n$.

34. The method of claim 32 further comprising a step of:
forming said differential output current as the sum of a plurality of differential output currents of the plurality of multiplying cells.

35. The method of claim 32 further comprising steps of:
providing each bit of said digital input on a distinct one of a plurality of bit lines, wherein each bit has a significance from most significant to least significant; and
connecting each bit line to a binary-weighted number of multiplying unit cells, wherein said binary-weighted number matches the significance of the bit of said bit line.

36. The method of claim 32 further comprising steps of:
providing each bit of said digital input on a distinct one of a plurality of bit lines, wherein each bit has a significance from most significant to least significant; and
connecting at least one bit line of said plurality of bit lines to a multiplying interpolation cell, wherein said interpolation cell provides an output level that matches the significance of the bit of said at least one bit line.

37. The method of claim 32 further comprising steps of:
providing said plurality of multiplying cells as component-matched identical cells; and
matching propagation delays along a local oscillator transmission line, an output transmission line, and a plurality of bit lines.

38. A method for direct bits-to-RF digital-to-analog conversion comprising steps of:
propagating a local oscillator signal along an input transmission line;
propagating a digital input signal along a plurality of bit control lines, said digital input signal comprising a plurality of bits, and said plurality of bits forming a digital word having a value $b_n$;
connecting a plurality of multiplying cells to said input transmission line and to an output transmission line, each of said plurality of multiplying cells establishing a differential local oscillator current; and
toggling said differential local oscillator currents on said output transmission line using said multiplying cells so that a differential output current is the product of said value $b_n$ and said differential local oscillator current.

39. The method of claim 38 wherein said connecting step comprises matching propagation delays of said multiplying cells between said input transmission line and said output transmission line.

40. The method of claim 38 wherein said digital input signal has a resolution of at least three bits.

41. The method of claim 38 wherein:
said digital input signal has N bits;
said plurality of multiplying cells includes a number m of interpolation cells; and
the number of said plurality of multiplying cells is $(2^{N-m}-1)+m$.

42. The method of claim 38 wherein said local oscillator signal has a frequency at least as high as a microwave frequency.

43. A communication system comprising:
a traveling wave, multiplying digital-to-analog converter for conversion of a digital input to a high frequency analog output, said digital-to-analog converter having propagation-delay matched transmission lines wherein:
an array of constant high impedance, multiplying cells are connected along said transmission lines, at least one of which propagates said high frequency analog output; and
said array of constant high impedance, multiplying cells are connected along bit lines that propagate said digital input.

44. The communication system of claim 43 wherein said array of multiplying cells are interleavedly connected to said bit lines so that linearity of digital to analog conversion is preserved in the presence of a linear gradient δ from one cell to another across said array of multiplying cells.

45. The communication system of claim 43 wherein said array of multiplying cells are identical component-matched multiplying cells having nominally identical impedances and propagation delays so that a plurality of output signals from each multiplying cell combine in phase on at least one of said transmission lines.

46. The communication system of claim 43 wherein said high frequency is at least 1.0 GHz.

47. The communication system of claim 43 wherein said digital input has a data rate of at least 1.0 Gbit/s.

48. The communication system of claim 43 wherein said digital input has a resolution of at least three bits.

49. The communication system of claim 43 wherein a multiplying cell of said array of multiplying cells includes:
- a local oscillator input that receives a continuous time local oscillator input signal;
- a digital input that receives a single bit digital input; and
- a balanced output, having a constant output impedance, that yields a differential output current signal, said differential output current signal being the multiplication of said continuous time local oscillator input signal by said single bit digital input.

* * * * *